United States Patent
Wann et al.

(10) Patent No.: US 7,791,109 B2
(45) Date of Patent: Sep. 7, 2010

(54) METAL SILICIDE ALLOY LOCAL INTERCONNECT

(75) Inventors: Clement H. Wann, Carmel, NY (US); Haining S. Yang, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 637 days.

(21) Appl. No.: 11/693,035

(22) Filed: Mar. 29, 2007

(65) Prior Publication Data

US 2008/0239792 A1 Oct. 2, 2008

(51) Int. Cl.
*H01L 27/10* (2006.01)
*H01L 27/11* (2006.01)
*G11C 5/06* (2006.01)
*G11C 11/00* (2006.01)
*G11C 11/34* (2006.01)

(52) U.S. Cl. ............... 257/206; 257/903; 257/E21.661; 257/E27.098; 257/E27.099; 365/72; 365/154; 365/182

(58) Field of Classification Search ................. 257/206, 257/903, E21.661, E27.098, E27.099; 365/72, 365/154, 182

See application file for complete search history.

(56) References Cited

U.S. PATENT DOCUMENTS

| 6,605,533 | B2 | 8/2003 | Trivedi |
| 7,049,680 | B2 | 5/2006 | Ikeda et al. |
| 2005/0141268 | A1* | 6/2005 | Ahn ........................... 365/154 |
| 2005/0224877 | A1* | 10/2005 | Liaw .......................... 257/347 |
| 2006/0024940 | A1* | 2/2006 | Furukawa et al. ........... 438/597 |
| 2006/0091468 | A1* | 5/2006 | Liaw .......................... 257/368 |

* cited by examiner

*Primary Examiner*—David S Blum
(74) *Attorney, Agent, or Firm*—Scully, Scott, Murphy & Presser, P.C.; Ian D. MacKinnon, Esq.

(57) ABSTRACT

A local interconnect is formed with a gate conductor line that has an exposed sidewall on an active area of a semiconductor substrate. The exposes sidewall comprises a silicon containing material that may form a silicide alloy upon silicidation. During a silicidation process, a gate conductor sidewall silicide alloy forms on the exposed sidewall of the gate conductor line and an active area silicide is formed on the active area. The two silicides are joined to provide an electrical connection between the active area and the gate conductor line. Multiple sidewalls may be exposed on the gate conductor line to make multiple connections to different active area silicides.

11 Claims, 20 Drawing Sheets

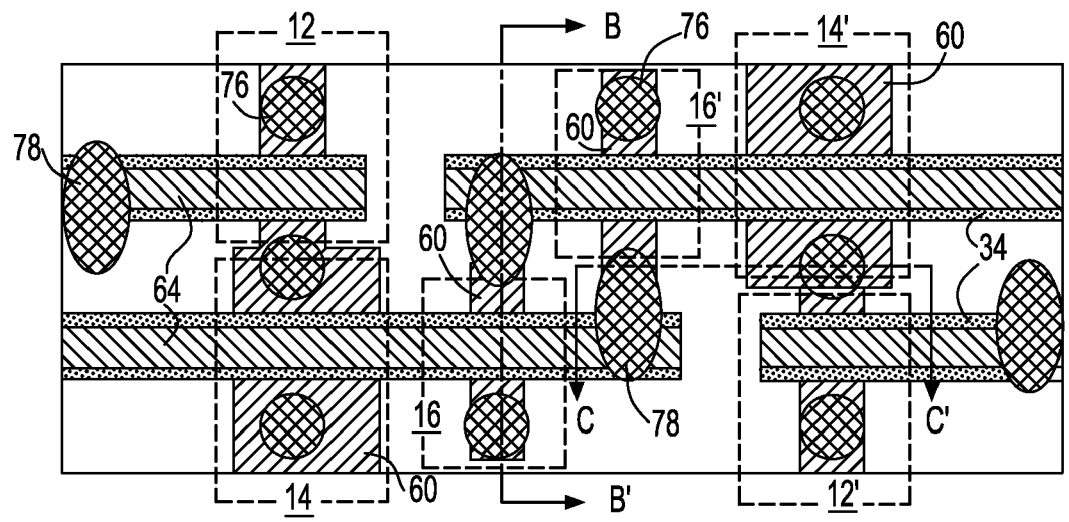
FIG. 1A
(PRIOR ART)
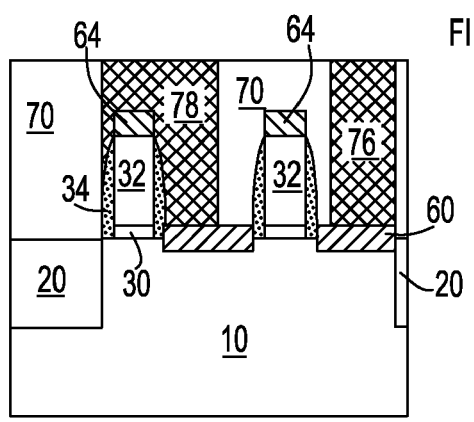 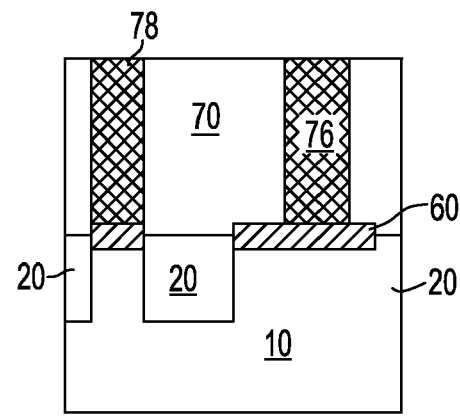
FIG. 1B
(PRIOR ART)
FIG. 1C
(PRIOR ART)

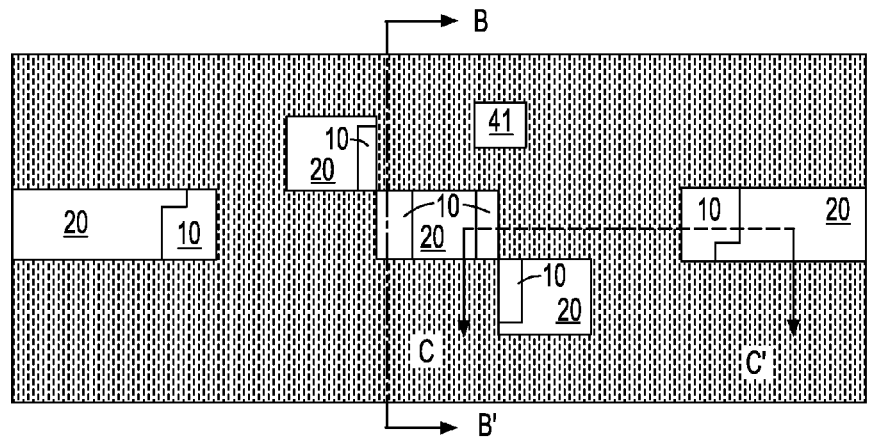
FIG. 9A
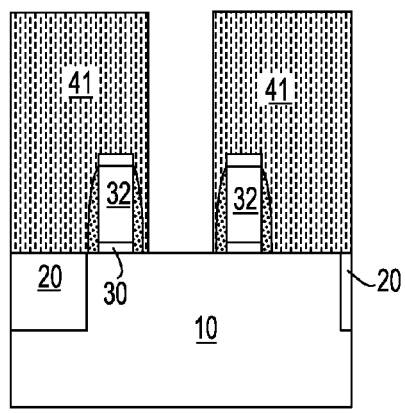 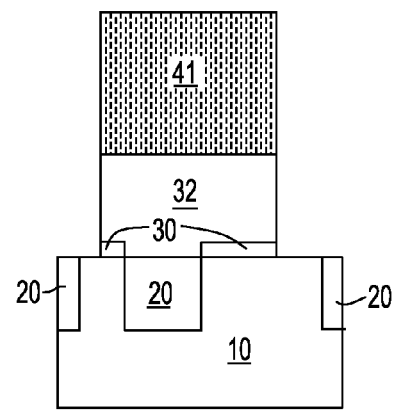
FIG. 9B          FIG. 9C

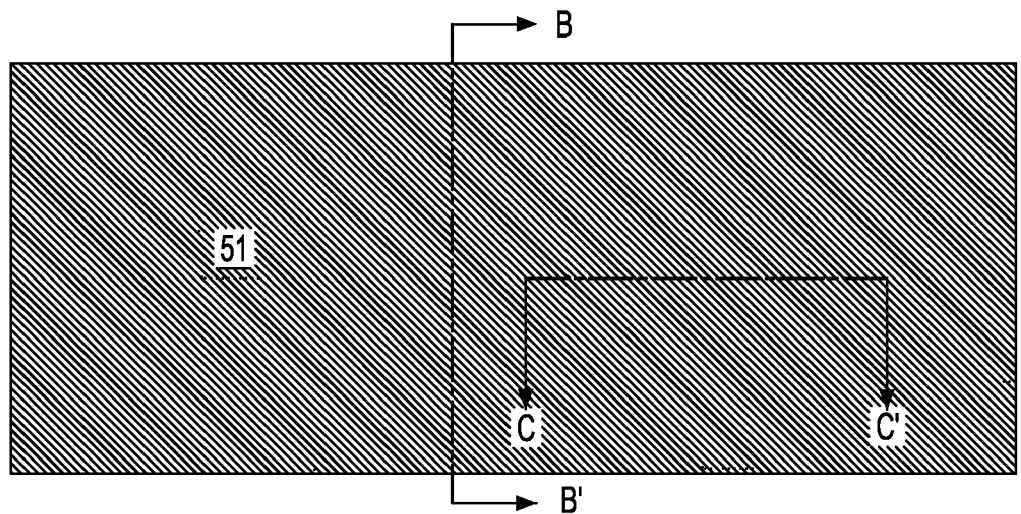
FIG. 14A
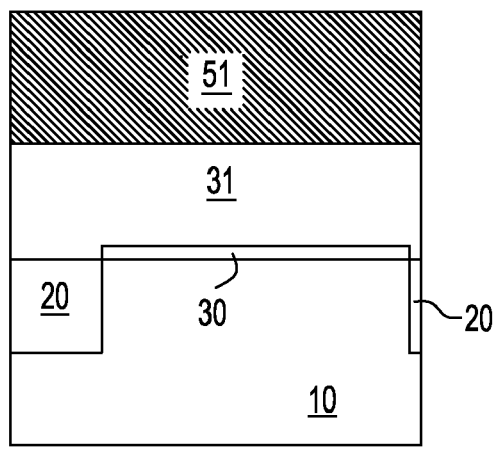 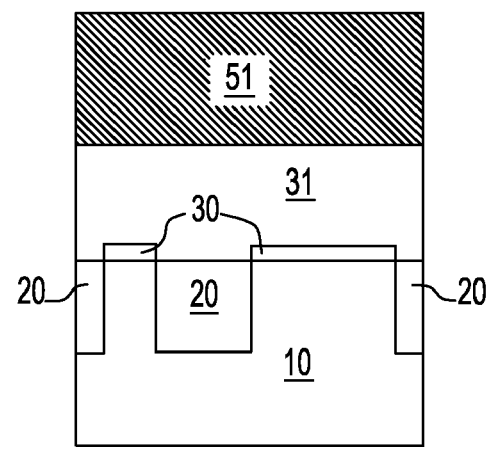
FIG. 14B    FIG. 14C

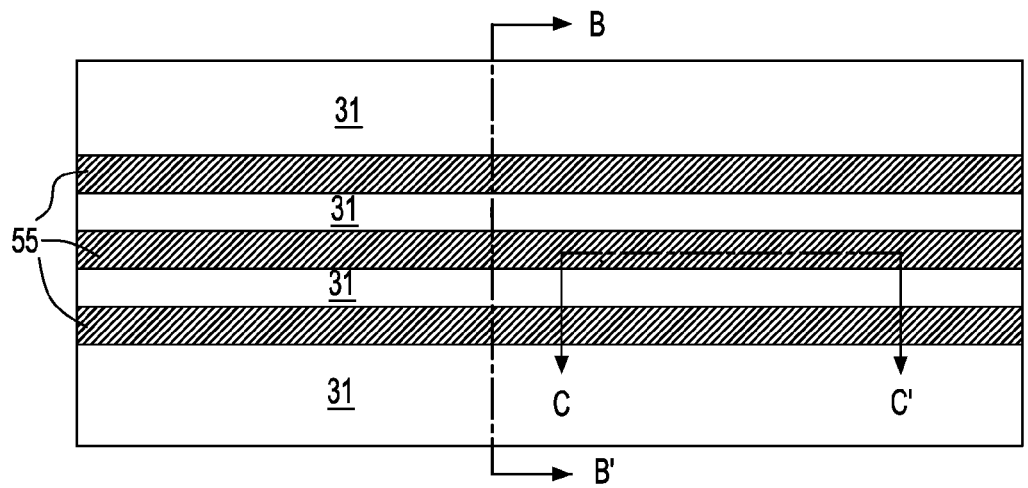
FIG. 17A
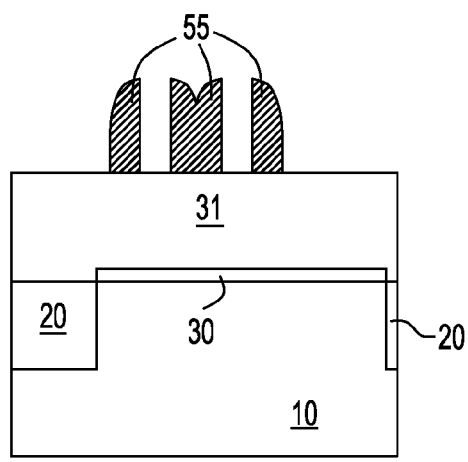 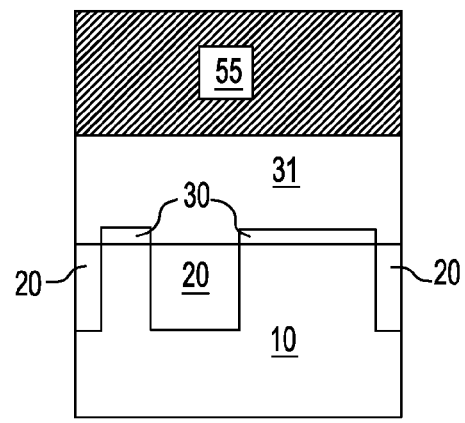
FIG. 17B    FIG. 17C

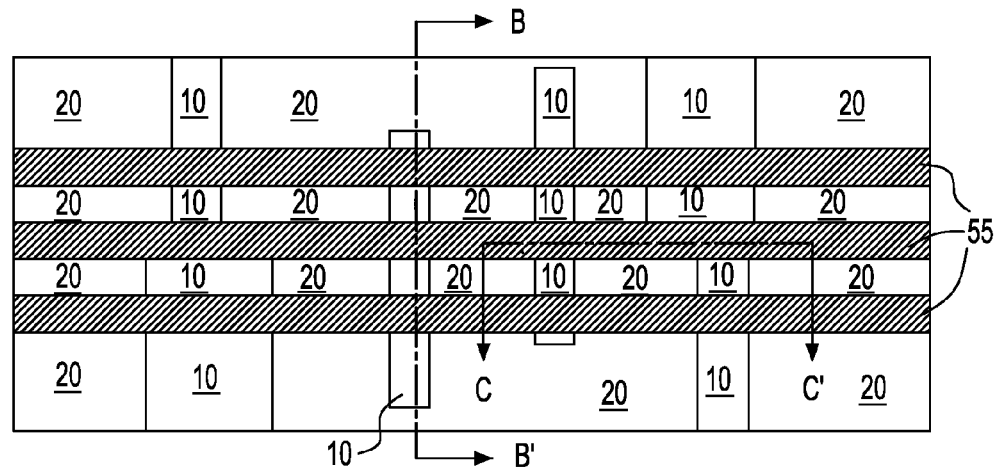
FIG. 18A
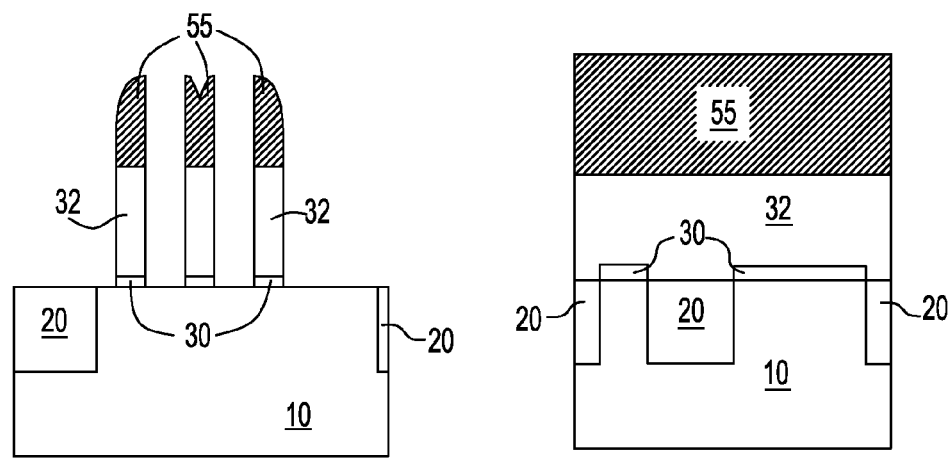
FIG. 18B
FIG. 18C

US 7,791,109 B2

1

METAL SILICIDE ALLOY LOCAL INTERCONNECT

FIELD OF THE INVENTION

The present invention relates to semiconductor structures, and particularly to semiconductor structures with a local interconnect formed with metal silicide alloys and methods of manufacturing the same.

BACKGROUND OF THE INVENTION

With continual scaling of semiconductor devices in each new generation, semiconductor technologies face challenges in circuit design and processing technology. Circuits with complex wiring pose additional challenges since wiring of semiconductor devices is constrained by lithographic limitations.

For example, conventional static random access memory (SRAM) devices require complex wiring even at an M1 level (the first metal wiring level above a semiconductor substrate) since the internal nodes of an SRAM cell need to be connected at the M1 level. The use of the M1 level for internal node wiring forces the wiring of the bit lines into an M2 level (the second wiring level above the semiconductor substrate) and the wiring of word lines into an M3 level (the third wiring level above the semiconductor substrate). For conventional SRAM circuits, power buses are thus typically used only in an M4 level and above.

It is advantageous, however, to use a reduced number of wiring levels for a circuit and to minimize the wiring lengths since interconnect wires in each wiring level are capacitively coupled to adjacent interconnect wires, wiring vias, contact vias, and/or gate electrode lines. In the case of SRAM devices, the internal node connection at an M1 level and the bit lines and word lines at M2 and M3 introduce parasitic capacitance between the interconnect wires in each wiring level and other interconnect structures nearby.

Further, other semiconductor devices in general may employ a local interconnect containing an M1 wire to electrically connect a polysilicon conductor (PC) level conductive structure, such as a gate top silicide, to an active area (AA) level conductive structure, such as a source and drain silicide. PC level refers to the level of gate conductors and AA level, or recessed oxide (RX) level as it is alternatively called, refers to the level of the top surface of the source and drain in conventional planar metal-on-semiconductor (MOS) transistors. Such a local interconnect between the PC level and the AA level requires contact array (CA) level contact vias as well as the M1 wire. This approach in general adds at least three wiring components, i.e., two contact array (CA) level contact vias and one M1 wire to each local interconnect, and thus adds substantial parasitic capacitive coupling to the device components nearby as well as occupying a volume of the M1 level that may not be utilized for other wiring. Further, the two conductive structures that are electrically connected by the local interconnect need to be separated at least by a minimum distance between the two adjacent CA contact vias imposed by lithographic constraints, which is typically on the order of the diameter of the CA contact vias. To electrically connect three or more conductive components, more CA contact vias are employed.

Alternatively, contact array bars (CA bars) in the shape of a cylinder with a substantially oval cross-sectional area and formed in the CA level are employed to connect two adjacent conductive structures between the PC level and the AA level. While capable of providing a local interconnection between a

2

PC level conductive structure and an AA level conductive structure, a local interconnect with a CA bar requires that the two conductive structures are located within the cross-sectional area of the CA bar, and substantially abutting or almost abutting each other. Therefore, CA bars do not provide a local interconnect solution to a pair of conductive structures in the PC level or in the AA level that are separated by a distance longer than the horizontal dimensions of a CA bar. Moreover, it is difficult to produce both circular shaped CA and oval shaped CA bar together due to the fact they require different illumination conditions during printing step and they have different etch bias during etch step. The appearance of various shapes on one level reduces process window significantly.

Referring to FIG. 1A-1C, an exemplary prior art SRAM structure comprises a first pull-up PFET 16, a second pull-up PFET 16', two pull down NFETs (14, 14'), and two pass gate NFETs (12, 12'). FIG. 1A is a top-down view of the exemplary prior art structure up to the CA level not showing a middle-of-line (MOL) dielectric 70. FIG. 1B is a vertical cross-sectional view of the exemplary prior structure along the plane B-B' showing the MOL dielectric 70. FIG. 1C is a vertical cross-sectional view of the exemplary prior structure along the plane C-C' showing the MOL dielectric 70. Each of the transistors (12, 12', 14, 14', 16, 16') comprise a portion of the semiconductor substrate 10, a gate dielectric 30, a gate conductor 32, a gate spacer 34, active area (AA) silicides 60, and gate top silicides 64. Shallow trench isolation 20 physically separates the transistors (12, 12', 14, 14', 16, 16') and provides electrical isolation among the transistors (12, 12', 14, 14', 16, 16'). CA contact vias 76 and CA bars 78 are employed to provide electrical wiring among the transistors (12, 12', 14, 14', 16, 16'). One of the CA bars 78, which contacts one of the AA silicides 60 of the first pull-up PFET 16 as well as the gate top silicides 64 of the second pull-up PFET 16' as shown in FIG. 1B, provide electrical connection between the drain of the first pull-up PFET 16 and the gate of the second pull-up PFET 16'. Likewise, another CA bar 78 provides electrical connection between the drain of the second pull-up PFET 16' and the gate of the first pull-up PFET 16.

Referring to FIGS. 2A-2C, the exemplary prior art SRAM structure is shown up to the M1 level. FIG. 2A is a top-down view of the exemplary prior art structure up to the M1 level not showing the middle-of-line (MOL) dielectric 70 and an M1 dielectric 80. FIG. 2B is a vertical cross-sectional view of the exemplary prior structure along the plane B-B' showing the MOL dielectric 70 and the M1 dielectric 80. FIG. 2C is a vertical cross-sectional view of the exemplary prior structure along the plane C-C' showing the MOL dielectric 70 and the M1 dielectric 80. M1 wires 88 embedded within the M1 dielectric 80 contact the underlying CA contact vias 76 and the CA bars 78. In the exemplary prior art SRAM structure, FIGS. 2A and 2C illustrate that the drain of each of the two pull-up transistors (16, 16') is electrically connected to a node at which a source/drain of one of the pass gate transistors (12, 12') adjoins the drain of one of the pull-down NFETs (14, 14') by a combination of a CA bar 78, an M1 wire 88, and a CA contact via 76. Two such combinations are present in each SRAM cell structure which comprises six transistors (12, 12', 14, 14', 16, 16').

Referring to FIG. 3, a circuit schematic 18 for the exemplary prior art SRAM structure shows a first pair of a first pass gate n-type field effect transistor (NFET) 2 and a first pull-down n-type field effect transistor (NFET) 4 wherein a first source/drain of the first pass gate NFET 2 and a first drain of the first pull down NFET 4 are adjoined to form an electrical connection. In the physical structure, this electrical connection is achieved by a first common active area that contains both the first source/drain of the first pass gate NFET 2 and the first drain of the first pull-down NFET 4. Similarly, a second source/drain of the second pass gate NFET 2' and a second drain of a second pull-down NFET 4' are adjoined to form another electrical connection. In the physical structure, this electrical connection is achieved by a second common active area that contains both the second source/drain of the second pass gate NFET 2' and the second drain of the second pull-down NFET 4'. The circuit schematic 18 further comprises a first pull-up p-type field effect transistor (PFET) 6 containing a third drain, which is physically a third active area, and a second pull-up PFET 6' containing a fourth drain, which is physically a fourth active area. Each of the source/drain nodes of the pass gate transistors (2, 2') may function as a source or a drain depending on the operation of the SRAM circuit.

According to the prior art, the third active area is electrically connected to the first active area via a collection of a first contact via, a first M1 wire, and a first CA bar. This connection is represented in the circuit schematic 18 by a first internal node 11. Similarly, the fourth active area is electrically connected to the second active area via a collection of a second contact via, a second M1 wire, and a second CA bar. This connection is represented in the circuit schematic 18 by a second internal node 11'. The gates of the second pull-up PFET 6' and the second pull-down NFET 4' are adjoined to the third drain of the first pull-up PFET 6 via the first CA bar. This connection is represented in the circuit schematic 18 by a third internal node 13A and a fourth internal node 13B. The gates of the first pull-up PFET 6 and the first pull-down NFET 4 are adjoined to the fourth drain of the second pull-up PFET 6' via the first CA bar. This connection is represented in the circuit schematic 18 by a fifth internal node 13A' and a sixth internal node 13B'.

According to the prior art, the internal nodes (11, 11', 13A, 13B, 13A' 13B') are connected by CA contact vias 76 and CA bars 78 as well as M1 wires 88. The use of the M1 wires blocks substantial area at the M1 level from being utilized for other wiring purposes. Therefore, both the bit line wiring (15, 15') and word line wiring (17, 17') need to be implemented above the M1 level not to lose area efficiency in an SRAM design. Further, substantial inter-level capacitance is introduced by the use of M1-M3 levels in the SRAM structure according to the prior art.

In summary, prior art local interconnect methods between two conductive components within the PC level and the CA level have severe limitations in terms of the proximity between the two components. CA bars provide a local interconnect only between an adjacent pair of a PC level conductive structure and an AA level conductive structure separated by a distance less than the dimension of the CA bars, which is at most about twice the diameter of a CA contact via. A local interconnect employing a combination of CA contact vias and an M1 wire requires a minimum separation between the two interconnected structures, typically by a distance greater than the diameter of a CA contact via. More importantly, the M1 wire occupies a volume in M1 level, preventing the use of the volume for other M1 level wiring structures. Further, the prior art local interconnect methods also introduce parasitic capacitance between the local interconnect structure and other semiconductor components. In the case of the exemplary prior art SRAM structure discussed above, the local interconnect structures that connect internal nodes, specifically the local interconnect structures that connects each of the pass gate transistors to the drains of one of the two pairs of a pull-up PFET and a pull-down NFET, occupies the M1 level, making utilization of the M1 level for bit line wiring impractical, and also increasing the parasitic capacitance of the internal nodes.

Therefore, there exists a need for a local interconnect structure that connects a pair of at least two conductive structures in the PC level and/or in the AA level that does not occupy a space in an M1 level and methods of manufacturing the same.

Furthermore, there exists a need for a local interconnect structure for an SRAM in which internal nodes may be wired without utilizing M1 level wiring and methods of manufacturing the same.

SUMMARY OF THE INVENTION

The present invention addresses the needs described above by providing a local interconnect structure comprising a gate conductor sidewall silicide alloy contacting both a gate conductor line and an active area silicide alloy and methods of manufacturing the same.

Specifically, the present invention provides a gate conductor line that has an exposed sidewall over an active area of a semiconductor substrate. The exposed sidewall comprises a silicon containing material that may form a silicide alloy upon silicidation. During a silicidation process, a gate conductor sidewall silicide alloy forms on the exposed sidewall of the gate conductor line and an active area silicide alloy is formed on the active area. The two silicide alloys are joined to provide an electrical connection between the active area and the gate conductor line. Multiple sidewalls may be exposed on the gate conductor line to make multiple connections to different active area silicides.

According to the present invention, a semiconductor structure comprises:

a gate conductor sidewall silicide alloy located directly on a gate conductor line; and an active area silicide alloy located directly on an active area of a semiconductor substrate, wherein the gate conductor sidewall silicide alloy adjoins the active area silicide alloy.

The semiconductor structure may further comprise a gate dielectric directly contacting the gate conductor sidewall silicide alloy and the active area silicide alloy. Also, the semiconductor may further comprise a gate conductor top silicide alloy located on a top surface of the gate conductor line. Furthermore, the semiconductor structure may further comprise a contact via contacting the gate conductor top silicide alloy.

Both the gate conductor sidewall silicide alloy and the active area silicide alloy comprise a material selected from the group consisting of a metal silicide, a metal silicide-metal germanide alloy, a metal silicide-metal germanide alloy, and a metal silicide-metal germanide-metal carbide alloy.

Preferably, the gate conductor sidewall silicide alloy and the active area silicide alloy comprise the same material.

The semiconductor structure may further comprise:

another gate conductor sidewall silicide alloy located directly on the gate conductor line; and another active area silicide alloy located directly on another active area of the semiconductor substrate, wherein the another gate conductor sidewall silicide alloy adjoins the another active area silicide alloy.

The semiconductor structure may further comprise another gate dielectric directly contacting the another gate conductor sidewall silicide alloy and the another active area silicide alloy.

Preferably, the gate conductor sidewall silicide alloy, the active area silicide alloy, the another gate conductor sidewall silicide alloy, and the active area silicide alloy comprise the same material.

Also, the semiconductor structure may further comprise shallow trench isolation directly contacting the gate conductor line.

A static random access memory (SRAM) cell structure is also provided, which comprises:

a first pair of a first pass gate NFET and a first pull-down NFET, the first pair having a first active area containing a first source/drain of the first pass gate NFET and a first drain of the first pull-down NFET;

a second pair of a second pass gate NFET and a second pull-down NFET, the second pair having a second active area containing a second source/drain of the second pass gate NFET and a second drain of the second pull-down NFET;

a first pull-up PFET containing a third active area, wherein the third active area is electrically connected to the first active area via a first gate conductor line; and a second pull-up PFET containing a fourth active area, wherein the fourth active area is electrically connected to the second active area via a second gate conductor line.

Preferably, the SRAM cell structure further comprises:

a first gate conductor sidewall silicide alloy located directly on the first gate conductor line and adjoined to a first active area silicide alloy located directly on the first active area;

a second gate conductor sidewall silicide alloy located directly on the second gate conductor line and adjoined to a second active area silicide alloy located directly on the second active area;

a third gate conductor sidewall silicide alloy located directly on the first gate conductor line and adjoined to a third active area silicide alloy located directly on the third active area; and a fourth gate conductor sidewall silicide alloy located directly on the second gate conductor line and adjoined to a fourth active area silicide alloy located directly on the fourth active area.

More preferably, the SRAM cell structure further comprises:

a fifth gate conductor sidewall silicide alloy located directly on a gate conductor of the second pull-up PFET and adjoined to the third active area silicide alloy; and a sixth gate conductor sidewall silicide alloy located directly on a gate conductor of the first pull-up PFET and adjoined to the fourth active area silicide alloy.

The SRAM cell structure may further comprise:

a first gate dielectric directly contacting the first gate conductor sidewall silicide alloy and the first active area silicide alloy; and a second gate dielectric directly contacting the second gate conductor sidewall silicide alloy and the second active area silicide alloy.

The SRAM cell structure may further comprise:

a first gate conductor top silicide alloy located on a top surface of the first gate conductor line; and a second gate conductor top silicide alloy located on a top surface of the second gate conductor line.

Also, the SRAM cell structure may further comprise shallow trench isolation directly contacting the first gate conductor line and the second gate conductor line.

In addition to the above, the present invention also provides a method of manufacturing a semiconductor structure comprising:

forming at least one gate conductor line over a portion of an active area of a semiconductor substrate;

forming at least one exposed sidewall on the at least one gate conductor line; and forming at least one gate conductor sidewall silicide alloy on the at least one exposed sidewall and at least one active area silicide alloy on the active area, wherein the at least one gate conductor sidewall silicide alloy adjoins the at least one active area silicide alloy.

The inventive method may further comprise:

forming shallow trench isolation in the semiconductor substrate;

lithographically patterning the at least one gate conductor line after the forming of the at least one gate conductor line, wherein at least one edge of the lithographic pattern overlies the at least one gate conductor line and is located outside the shallow trench isolation; and etching an exposed portion of the at least one gate conductor line, wherein the etching exposes the at least one exposed sidewall substantially coincident with the at least one edge.

According to the present invention, a gate dielectric may be formed, wherein the at least one gate conductor sidewall silicide alloy and the at least one active area silicide alloy adjoin the gate dielectric.

A gate spacer may be formed on the at least one gate conductor line; and an exposed portion of the gate spacer may be etched during the etching of the exposed portion of the at least one gate conductor line.

The method may further comprise:

forming a silicon containing layer directly on the gate dielectric; and patterning the silicon containing layer to form the at least one gate conductor line.

According to a first embodiment of the present invention, the method may further comprise:

lithographically patterning the silicon containing layer; and etching the silicon containing layer.

According to a second embodiment of the present invention, the method may further comprise:

depositing a first dielectric layer directly on the silicon containing layer;

lithographically patterning the first dielectric layer;

depositing a second dielectric layer directly on the patterned first dielectric layer;

forming second dielectric spacers by a reactive ion etch;

removing the first dielectric layer; and etching the silicon containing layer employing the second dielectric spacers as a hardmask.

BRIEF DESCRIPTION OF THE DRAWINGS

FIGS. 1A-1C and 2A-2C show an exemplary prior art SRAM structure. FIGS. 1A-1C show the exemplary prior art SRAM structure up to the CA level. FIGS. 2A-2C show the exemplary prior art SRAM structure up to the M1 level. FIGS. 1A and 2A are top down views in which a middle-of-line (MOL) dielectric 70 and an M1 dielectric 80 are not shown. FIGS. 1B and 2B are vertical cross-sectional views of the exemplary prior structure along the plane B-B' showing the MOL dielectric 70. FIGS. 1C and 2C are vertical cross-sectional views of the exemplary prior structure along the plane C-C' showing the MOL dielectric 70 and the M1 dielectric 80.

FIGS. 4A-18C are sequential views of an exemplary SRAM structure according to the present invention during various stages of manufacture. FIGS. 4A-5C and FIGS.

7A-13C are common to a first embodiment and a second embodiment of the present invention.

DETAILED DESCRIPTION OF THE INVENTION

Figure 2A:
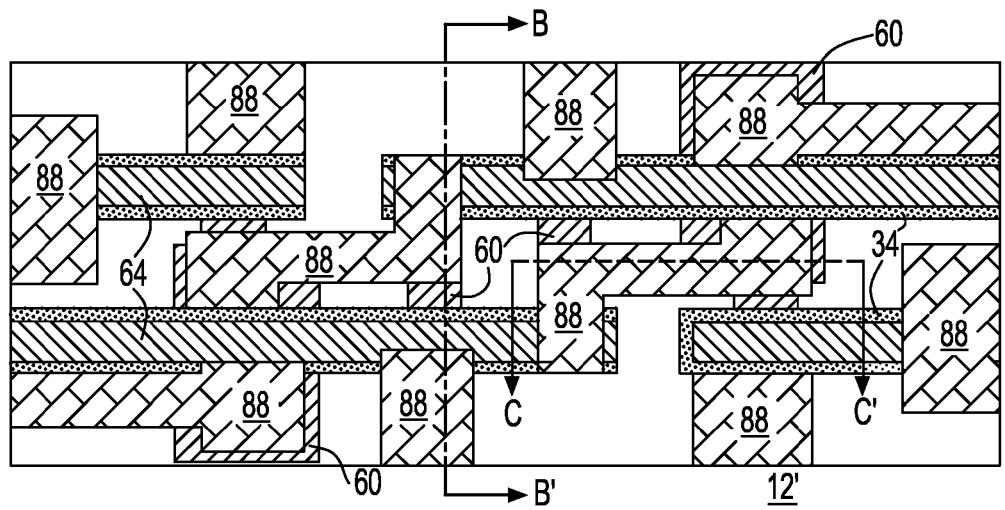
Figure 2B:
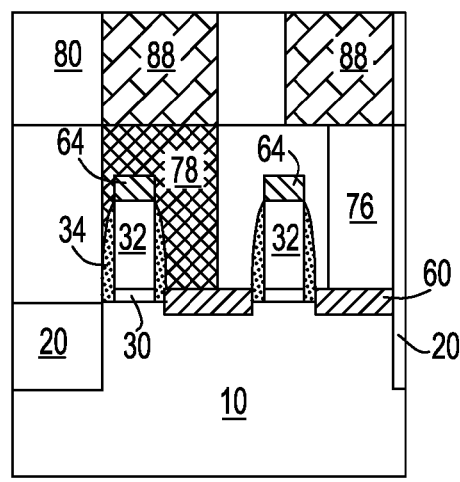
Figure 2C:
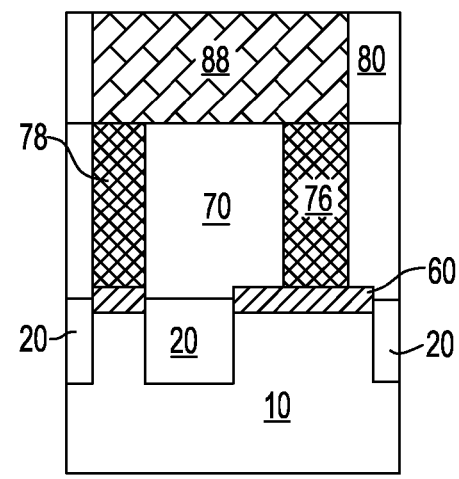

As stated above, the present invention relates to semiconductor structures with a local interconnect formed with metal silicide alloys and methods of manufacturing the same, which are now described in detail with accompanying figures.

It is noted that like and corresponding elements are referred to by like reference numerals. Figures with the same number correspond to the same stage of manufacture. Figures with the suffix "A" are top-down views, in which the MOL dielectric 70 and the M1 dielectric 80 are omitted for clarity. Figures with the suffix "B" or "C" are vertical cross-sections corresponding to the plane B-B' or to the plane C-C', respectively.

An exemplary SRAM structure is used to describe the elements of the present invention. The use of the exemplary SRAM structure in the description of the present invention does not limit the application of the present invention to SRAM structures in any way, but serves as a demonstration of the practicability of the present invention. Application of the features of the present invention as it is described in the exemplary SRAM structure to non-SRAM semiconductor structures is within the knowledge of one of ordinary skill in the art, and is herein explicitly contemplated.

Figure 4A:
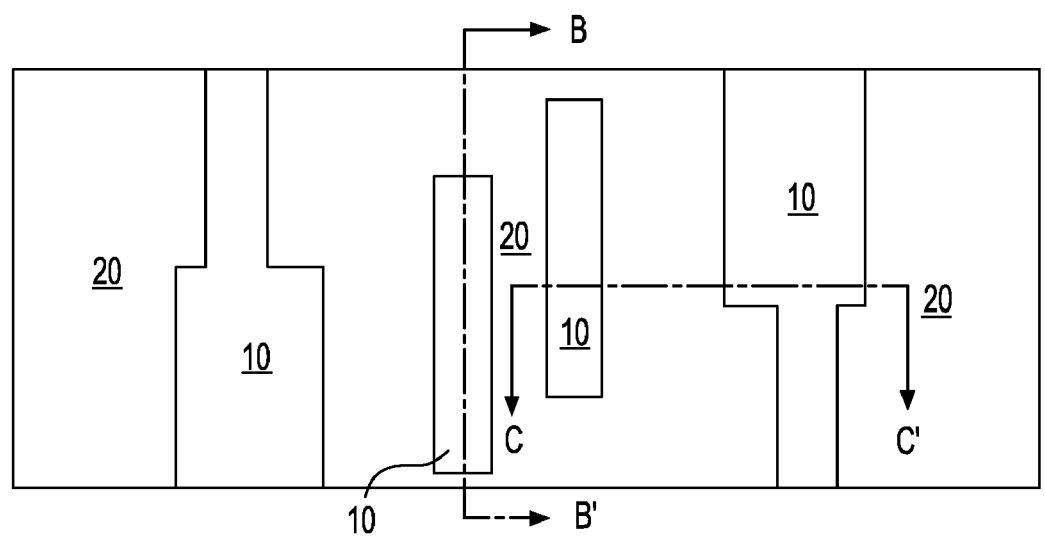

Referring to FIGS. 4A-4C, an exemplary SRAM structure comprises shallow trench isolation 20 and a gate dielectric 30. The shallow trench isolation 20 is formed in a semiconductor substrate 10 employing methods well known in the art. The gate dielectric 30 is formed on active areas, or the portions of the top surface of the semiconductor substrate 10 that are not occupied by the shallow trench isolation 20. Four active areas are shown in FIGS. 4A-4C. The active areas may be subdivided into smaller active areas during subsequent processing steps.

The semiconductor substrate 10 comprises a silicon containing semiconductor material. Non-limiting examples of silicon containing semiconductor materials include silicon, silicon-germanium alloy, silicon-carbon alloy, and silicon-germanium-carbon alloy. The silicon containing semiconductor material may be doped with electrical dopants or may be undoped, that is, substantially free of the electrical dopants. The gate dielectric 30 may comprise silicon oxide, silicon nitride, silicon oxynitride, a high-K dielectric layer, or a stack thereof.

Figure 5A:
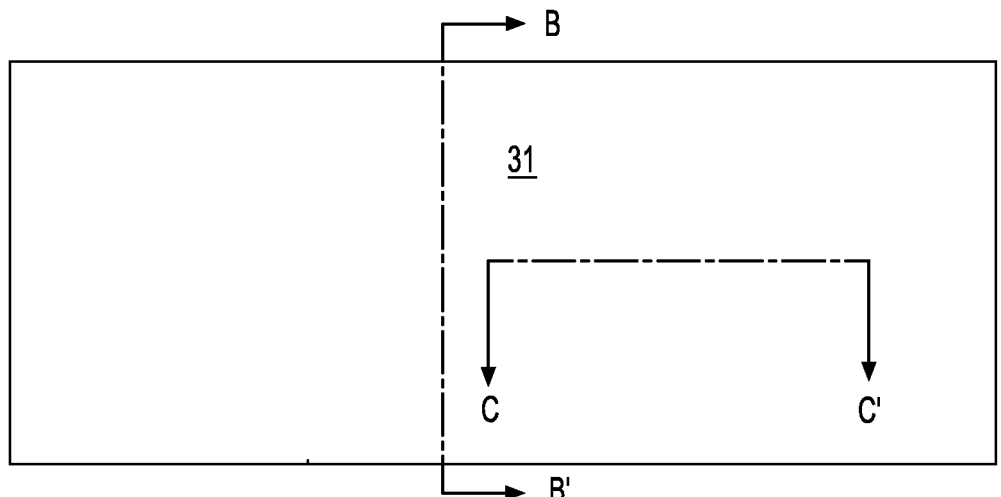
Figure 5B:
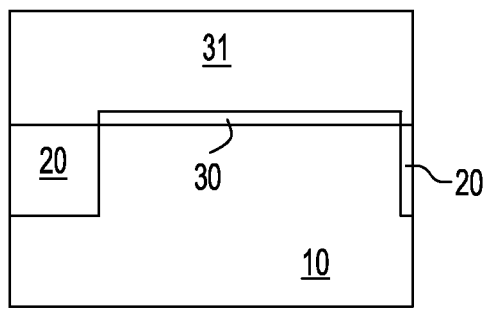
Figure 5C:
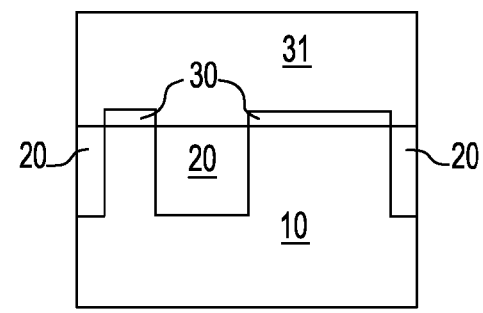

Referring to FIGS. 5A-5C, a silicon containing layer 31 is deposited on the gate dielectric 30 over the semiconductor substrate 10. The silicon containing layer 31 may comprise a semiconductor material selected from the group consisting of silicon, silicon-germanium alloy, silicon-carbon alloy, and silicon-germanium-carbon alloy. The silicon containing layer 31 may comprise a polycrystalline material or an amorphous material. The silicon containing layer 31 may be doped with electrical dopants such as boron, gallium, phosphorus, arsenic, antimony, or a combination thereof, or alternatively, the silicon containing layer 31 may be undoped, i.e., without a substantial amount of electrical dopants. The thickness of the silicon containing layer 31 may be in the range from about 30 nm to about 200 nm, and typically in the range from about 70 nm to about 150 nm.

Figure 6A:
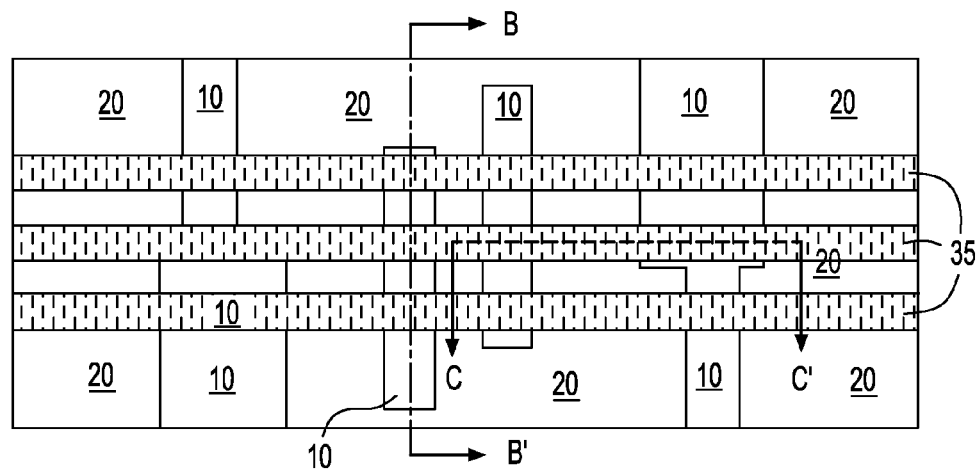
FIGS. 6A-6C apply to the first embodiment and FIGS. 14A-18C apply to the second embodiment of the present invention.
Figure 6B:
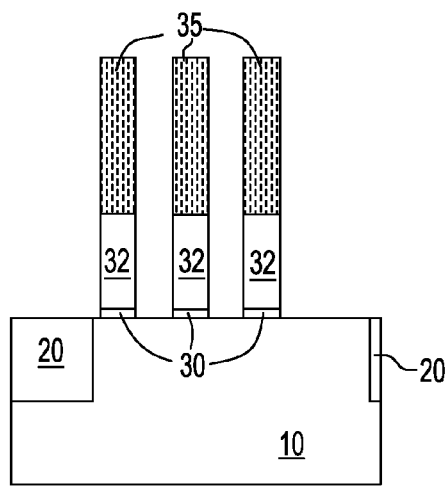
Figure 6C:
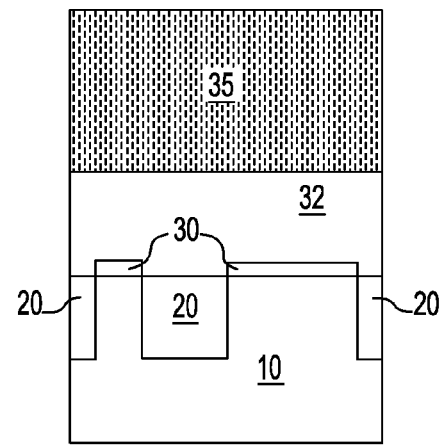

According to a first embodiment of the present invention, a first photoresist 35 is applied to the top surface of the silicon containing layer 31 and lithographically patterned as shown in FIGS. 6A-6C. The pattern in the first photoresist 35 contains shapes for gate conductor lines to be formed subsequently. The pattern in the first photoresist 31 is transferred into the silicon containing layer 31 to form gate conductor lines 32. The pattern is further transferred into the gate dielectric 30 so that exposed portions of the gate dielectric 30 is etched from the top of the semiconductor substrate 10. The first photoresist 35 is subsequently removed. A suitable surface clean may be employed thereafter.

Alternate methods may be employed to form the gate conductor lines 31 such as methods according to a second embodiment of the present invention, which will be shown below after description of the common processing steps of the first and the second embodiments of the present invention.

Figure 7A:
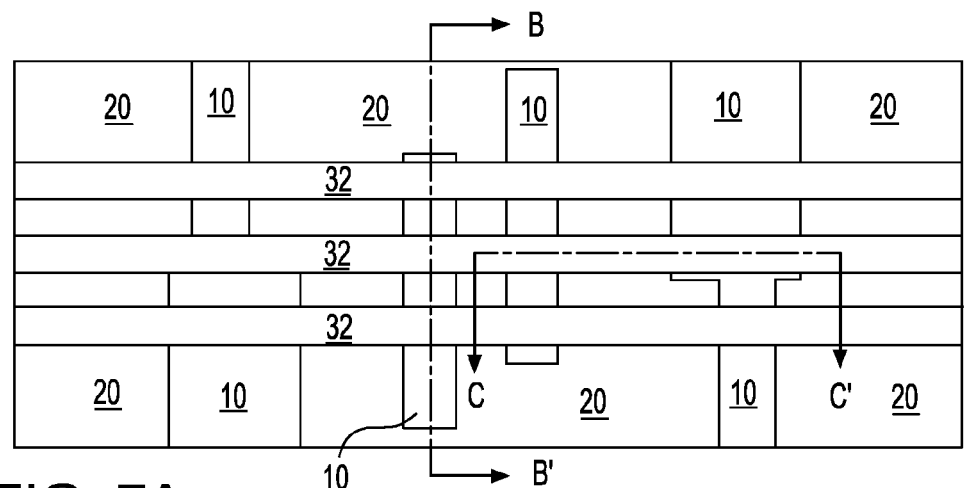
Figure 7B:
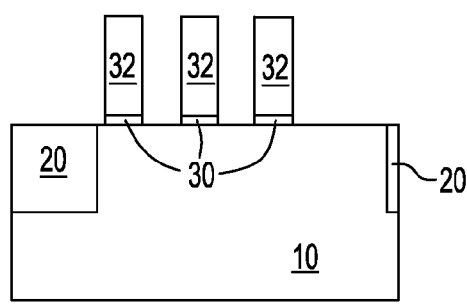
Figure 7C:
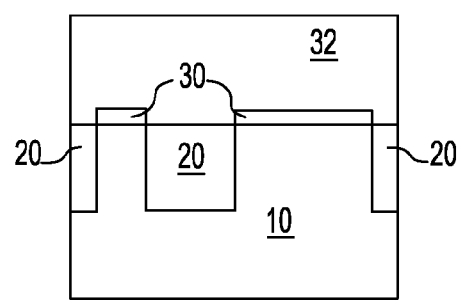

According to both embodiments of the present invention, the exemplary SRAM structure after the formation of the gate conductor lines 31 includes multiple gate conductor lines 32, each of which contacts a gate dielectric 30, which contacts the semiconductor substrate 10 as shown in FIGS. 7A-7C. The four active areas in FIGS. 4A-4C are now divided into an increased number of smaller active areas, as can be seen in FIG. 7A. The shallow trench isolation 20 and the gate conductor lines 32 separate the active areas, which are exposed surfaces of the semiconductor substrate 10. In the exemplary SRAM structure shown in FIGS. 7A-7C, three parallel gate lines 32 are formed.

Figure 8A:
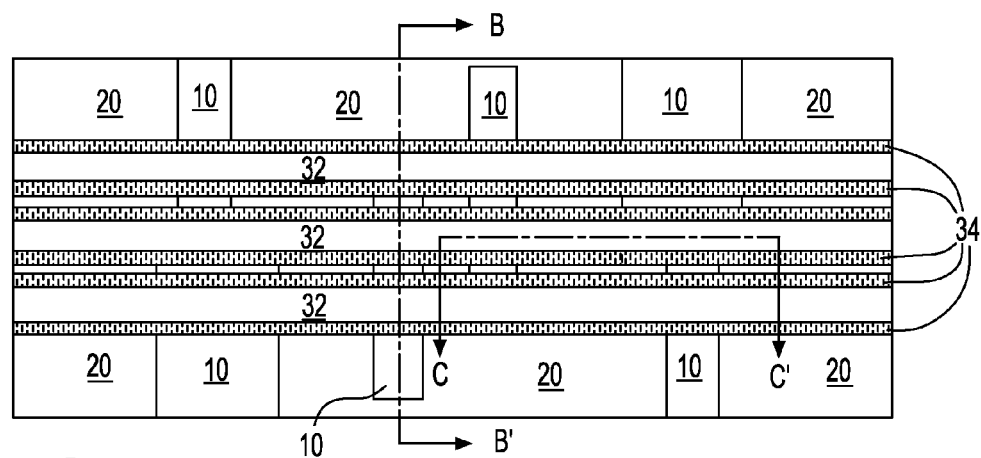
Figure 8B:
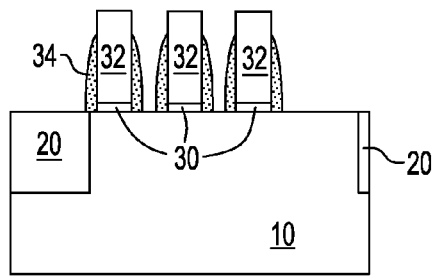
Figure 8C:
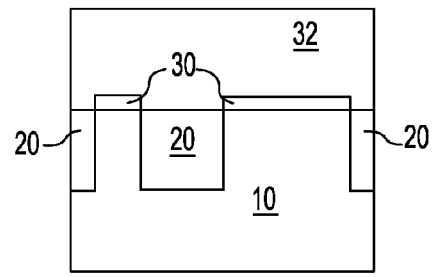

Referring to FIGS. 8A-8C, gate spacers 34 are formed around each of the gate conductor lines 32 by methods well known in the art, e.g., by conformal deposition of a dielectric layer followed by a reactive ion etch (RIE). The gate spacers 34 may comprise silicon oxide, silicon nitride, silicon oxynitride, or other dielectric materials. Preferably, the thickness of the gate spacers 34, as measured at the bottom of the gate spacers, that is, adjacent to the semiconductor substrate 10, is less than ½ of the distance between adjacent gate conductor lines 32. In the exemplary SRAM structure shown in FIGS. 8A-8C according to the present invention, the gate spacers 34 are formed on the sidewalls of the three parallel gate lines 32.

Referring to FIGS. 9A-9C, a second photoresist 41 is applied onto the gate conductor lines 32 and the semiconductor substrate 10 therebelow and lithographically patterned. According to the present invention, the pattern in the second photoresist 41 contains at least one edge that overlies one of the gate conductor lines 32 and is located outside the shallow trench isolation 20. In other words, a gate conductor line 32, a gate dielectric 30, and the semiconductor substrate 10 exist below the edge of the second photoresist 41 in a hypothetical vertical cross-section taken at the at least one edge of the second photoresist 41. In the exemplary SRAM structure shown in FIGS. 9A-9C, five holes are formed in the second photoresist 41. The area of each of the holes in the second photoresist 41 contains a portion of the gate conductor lines 32.

The pattern in the second photoresist 41 is subsequently transferred into the underlying portions of the gate conductor lines 32, the gate dielectric 30, and the gate spacers 34 by a reactive ion etch (RIE). Since the edge of the photoresist 41 contains at least one edge that overlies one of the gate conductor lines 32, the RIE exposes at least one sidewall of a gate conductor line 32. The exposed sidewall is substantially coincident with the at least one edge. At the end of the RIE, the portions of the gate conductor lines 32, the gate dielectric 30, and the gate spacers 34 within the holes are removed. The surface exposed by the RIE within the patterned holes comprises active areas and the top surface of the shallow trench isolation 20. Preferably, the area of each hole comprises an active area and a shallow trench isolation area. In the exemplary SRAM structure shown in FIGS. 9A-9C, eight exposed sidewalls of the gate conductor lines 32 are formed. Of the eight exposed sidewalls, six sidewalls are formed outside the shallow trench isolation 20.

Figure 10A:
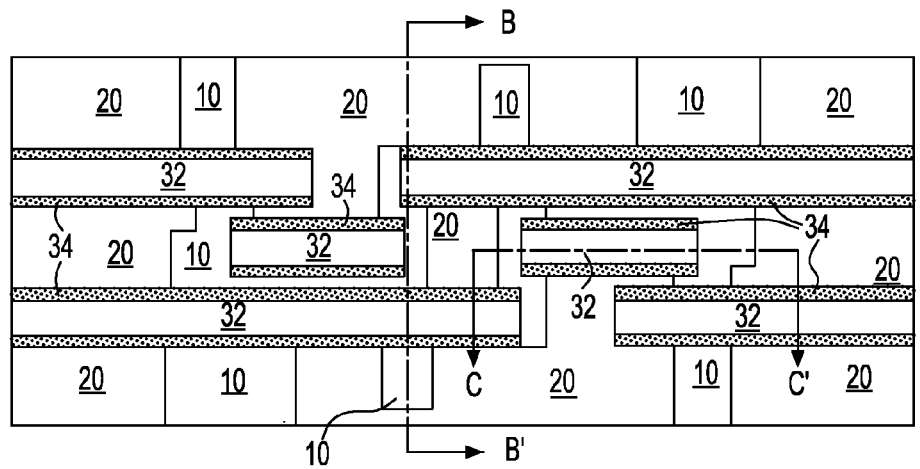
Figure 10B:
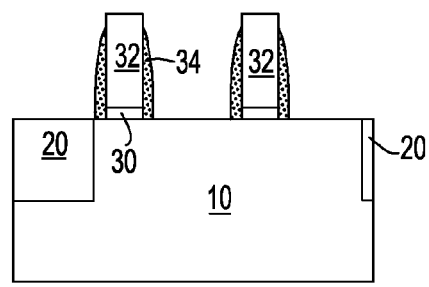
Figure 10C:
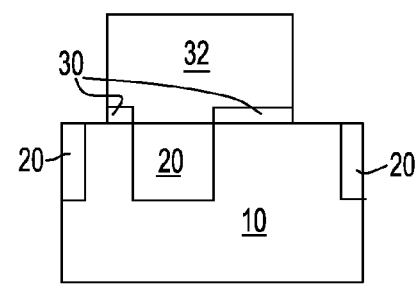

Referring to FIGS. 10A-10C, the second photoresist 41 is removed. A suitable surface clean may be performed at this point. In one aspect, at least one exposed sidewall of a gate conductor line 32 is formed outside the shallow trench isolation 20. In the exemplary SRAM structure shown in FIGS. 10A-10C, six sidewalls are located outside the shallow trench isolation 20.

Figure 11A:
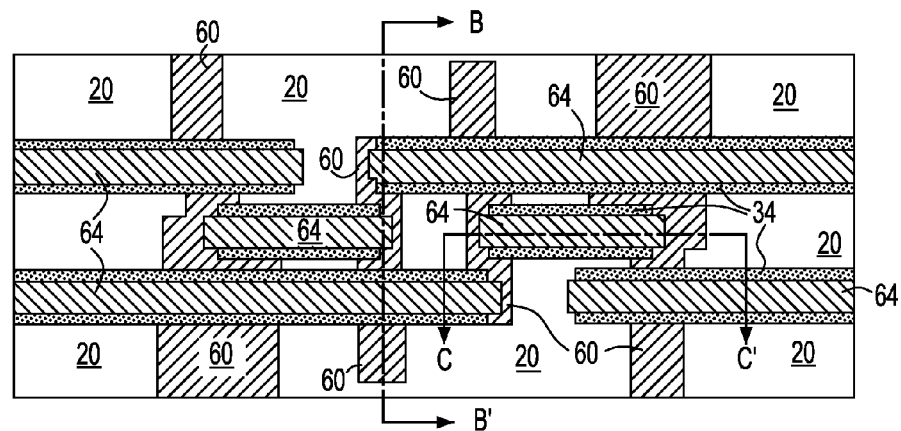
Figure 11B:
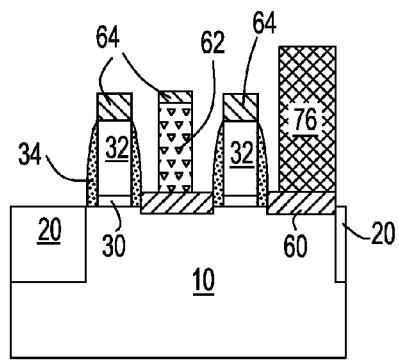
Figure 11C:
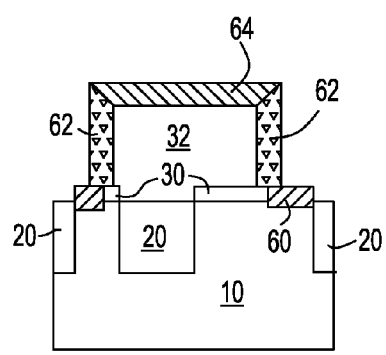

Referring to FIG. 11A-11C, silicide alloys are formed on the exposed semiconductor surfaces by depositing a metal layer (not shown) and reacting the metal layer with the underlying silicon containing semiconductor material during a silicidation process, as is well known in the art. The silicidation process comprises at least one anneal for silicide alloy formation and may comprise multiple anneals to optimize the quality of the silicide alloys. The metal layer is subsequently removed, for example, by a wet etch. If the underlying silicon containing material is silicon, a metal silicide is formed. If the underlying silicon containing material is an alloy of silicon with other material, a silicide alloy is formed. If the other material comprises germanium and/or carbon, the silicide alloy comprises silicide-germanide alloy and/or silicide-carbide alloy. Some silicon containing material is consumed to provide silicon material to the silicide alloy during the silicidation process.

According to the present invention, at least one active area silicide alloy 60 and at least one gate conductor sidewall silicide alloy 62 are formed during the silicidation process. Highly preferably, at least one gate conductor top silicide alloy 64 is also formed. Each of the at least one active area silicide alloy 60 is formed on an active area of the semiconductor substrate 10. Each of the at least one gate conductor sidewall silicide alloy 62 is formed on one of the exposed sidewalls of the at least one gate conductor line 32. Each of the at least one gate conductor top silicide alloy 64 is formed on one of the top surfaces of the gate conductor line 32.

Due to the incorporation of material from the metal layer, the surface of each of the silicide alloys is raised from the original surface of the semiconductor material prior to the silicidation process. The height of the expanded volume, that is, the distance of lateral expansion of the volume of the silicide alloy outside of the volume of the original semiconductor material prior to silicidation, is on the order of about ½ of the thickness of the silicide alloy. The thickness of a silicide alloy layer is in the range from about 10 nm to about 50 nm, and typically in the range from about 20 nm to about 30 nm. Correspondingly, the height of the expanded volume is in the range from about 5 nm to about 25 nm, and typically in the range from about 10 nm to about 15 nm.

In comparison, the thickness of the gate dielectric 30 is in the range from about 1 nm to about 10 nm, and typically in the range from about 1 nm to about 6 nm. Correspondingly, ½ of the thickness of the gate dielectric 30 is in the range from about 0.5 nm to about 5 nm, and typically in the range from about 0.5 nm to about 3 nm. Therefore, the height of the expanded volume exceeds ½ of the thickness of the gate dielectric 30.

During the silicidation process, the surface of each of the active area silicide alloy moves outward from the surface of the original semiconductor material along the exposed sidewall surfaces of an adjacent gate dielectric 30. At the same time, the surface of each of the gate conductor sidewall silicide alloy moves downward along the exposed sidewall surfaces of the gate dielectric 30. According to the present invention, the active area silicide alloy 60 and the gate conductor sidewall silicide alloy 62 are adjoined to collectively form an electrically conductive structure. Further, since the exposed sidewalls and top surfaces of the gate conductor lines 32 are adjoined, the gate conductor sidewall silicide alloy 62 and the gate conductor top silicide alloy 64 are also adjoined.

Figure 12A:
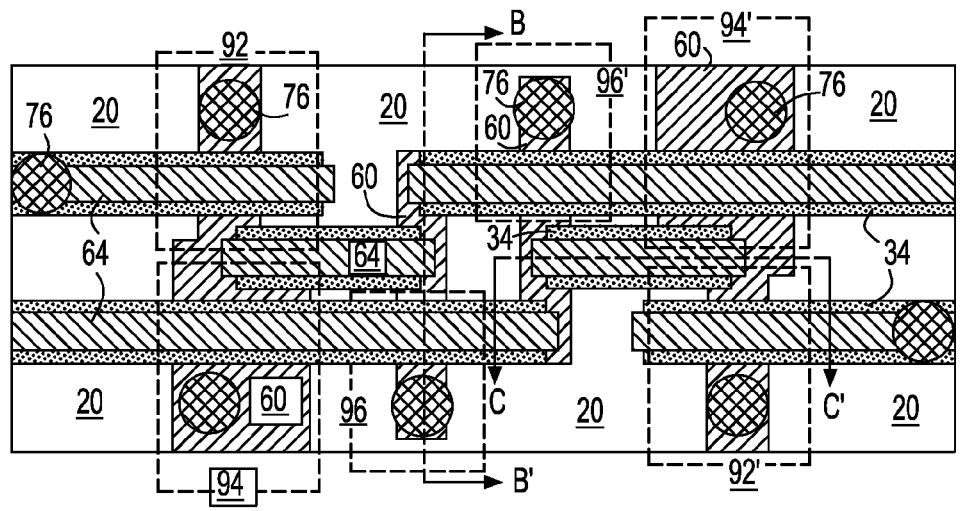
Figure 12B:
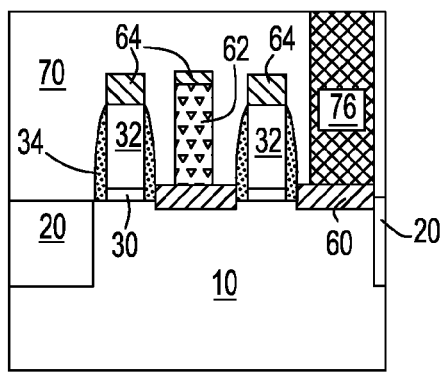
Figure 12C:
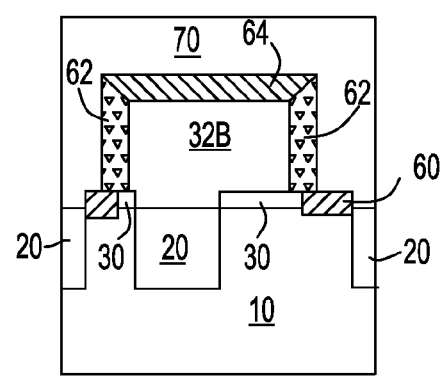
Figure 12D:
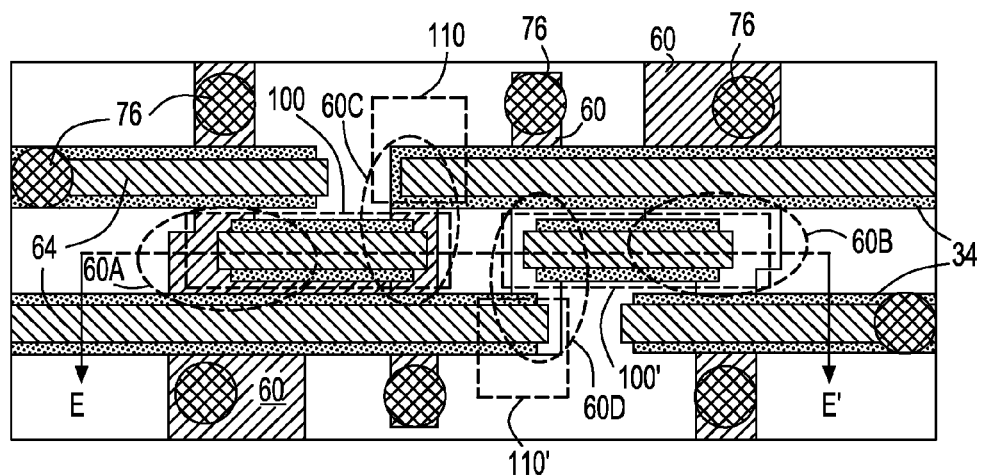
FIG. 12D is the same view as FIG. 12A illustrating different elements of the same structure.
Figure 12E:
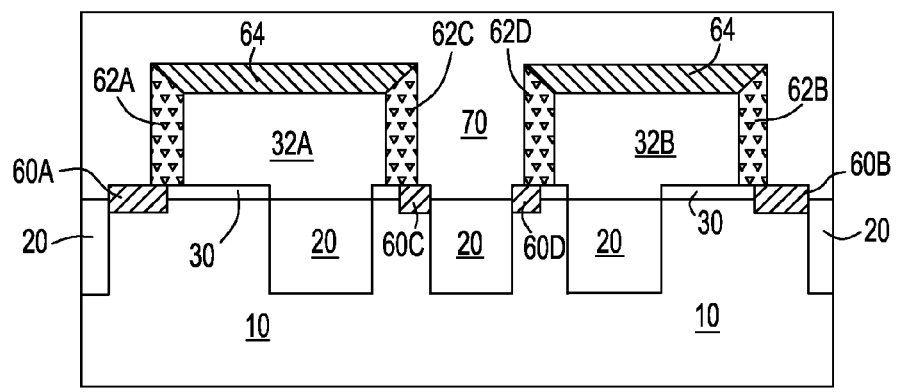
FIG. 12E is a vertical cross-sectional view of the structure in FIG. 12D along the plane E-E'.

Referring to FIGS. 12A-12E, a middle-of-line (MOL) dielectric 70 is deposited on the semiconductor substrate 10 and planarized. The MOL dielectric may be undoped silicate glass (USG), fluorosilicate glass (FSG), borophosphosilicate glass (BPSG), a spin-on low-k dielectric layer, or a chemical vapor deposition (CVD) low-k dielectric layer. Contact via holes are formed in the MOL dielectric 70 and are filled with metal to form CA contact vias 76. FIG. 12D is the same view as FIG. 12A, in which different components of the exemplary SRAM structure according to the present invention are identified.

In the exemplary SRAM structure shown in FIGS. 12A-12E, a first source/drain of a first pass gate NFET 92 (shown in FIG. 12A) and a first drain of a first pull-down n-type field effect transistor (NFET) 94 (shown in FIG. 12A) are electrically connected to form an electrical connection. This electrical connection is achieved by forming a first active area that contains both the first source/drain of the first pass gate NFET 92 and the drain of the first pull-down NFET 94 (shown in FIG. 12A). Similarly, a second source/drain of a second pass gate NFET 92' (shown in FIG. 12A) and a second drain of a second pull-down NFET 94' (shown in FIG. 12A) are electrically connected to form another electrical connection. This electrical connection is achieved by forming a second active area that contains both the second source/drain of the second pass gate NFET 92' and the second drain of the second pull-down NFET 94'. Further, a first pull-up PFET 96 (shown in FIG. 12A) contains a third active area which is electrically connected to the first active area via a first gate conductor line 100 (shown in FIG. 12D). A second pull-up PFET 96' (shown in FIG. 12A) contains a fourth active area, which is electrically connected to the second active area via a second gate conductor line 100' (shown in FIG. 12D). The third active area is the drain of the first pull-up PFET 96 and the fourth active area is the drain of the second pull-up PFET 96'. The roles of the first and second source/drain of the pass gate NFETs (92, 92') are determined by the operation mode of the exemplary SRAM structure, i.e., depending on whether a "0" or "1" is stored in the drains of the first or second pair of transistors.

According to the present invention, a first active area silicide alloy 60A (shown in FIGS. 12D and 12E) is formed on the first active area in the exemplary SRAM structure. A second active area silicide alloy 60B (shown in FIGS. 12D and 12E) is formed on the second active area. A third active area silicide alloy 60C (shown in FIGS. 12D and 12E) is formed on the third active area. A fourth active area silicide alloy 60D (shown in FIGS. 12D and 12E) is formed on the fourth active area. Each of the first, the second, the third, and the fourth active area silicide alloy are active area silicide alloys 60. Consequently, each of the reference numerals for the active area silicide alloys (60A, 60B, 60C, 60D) in FIG. 12D refers to only the portion of the area within each dotted oval in FIG. 12D that corresponds to the area of the active area silicide alloy 60 in FIG. 11A.

A first gate conductor sidewall silicide 62A (shown in FIG. 12E) is formed on the exposed sidewall of the first gate conductor line 32A (shown in FIG. 12E) adjacent to the first active area and adjoins the first active area silicide alloy 60A. A second gate conductor sidewall silicide 62B (shown in FIG. 12E) is formed on the exposed sidewall of the second gate conductor line 32B (shown in FIG. 12E) adjacent to the second active area and adjoins the second active area alloy silicide 60B. A third gate conductor sidewall silicide 62C (shown in FIG. 12E) is formed on the exposed sidewall of a first gate conductor line 32A (shown in FIG. 12E) adjacent to the third active area and adjoins the third active area silicide alloy 60C. A fourth gate conductor sidewall silicide 62D (shown in FIG. 12E) is formed on the exposed sidewall of a second gate conductor line 32B (shown in FIG. 12E) adjacent to the fourth active area and adjoins the fourth active area silicide alloy 60D.

In the exemplary SRAM structure according to the present invention, the first active area is electrically connected to the third active area by a first local interconnect structure 100 (shown in FIG. 12D) which comprises a first active area silicide alloy 60A, a first gate conductor sidewall silicide alloy 62A, a parallel connection of the first gate conductor line 32A and the first gate conductor top silicide alloy 64A (shown in FIG. 12E), a third gate conductor sidewall silicide alloy 62C, and the third active area silicide alloy 60C. Similarly, the second active area is electrically connected to the fourth active area by a second local interconnect structure 100' (shown in FIG. 12D) that comprises a second active area silicide alloy 60B, a second gate conductor sidewall silicide alloy 62B, a parallel connection of the second gate conductor line 32B and the second gate conductor top silicide alloy 64B (shown in FIG. 12E), a fourth gate conductor sidewall silicide alloy 62D, and the fourth active area silicide alloy 60D. According to the present invention, therefore, the third active area is electrically connected to the first active area via the first gate conductor line 32A and the fourth active area is electrically connected to the second active area via the second gate conductor line 32B in the exemplary SRAM structure.

The exemplary SRAM structure according to the present invention further comprises a third local interconnect structure 110 (shown in FIG. 12D) that comprises a fifth gate conductor sidewall silicide alloy located directly on a gate conductor of the second pull-up PFET 96' adjoined to the third active area silicide alloy 60C, and fourth local interconnect structure (shown in FIG. 12D) that comprises a sixth gate conductor sidewall silicide alloy located directly on a gate conductor of the first pull-up PFET 96 adjoined to the fourth active area silicide alloy 60D.

Figure 3:
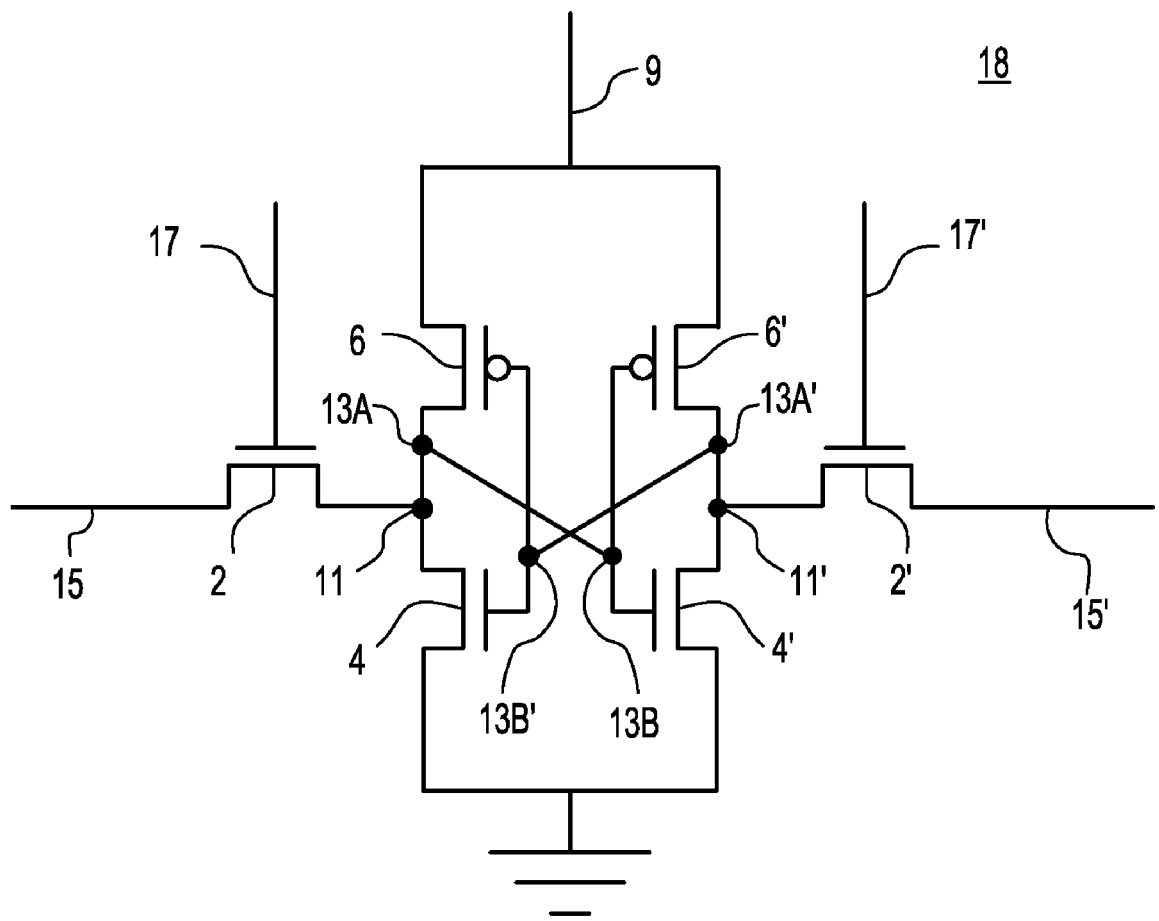
FIG. 3 is a circuit schematic for the exemplary prior art SRAM structure.

According to the present invention, the internal nodes (11, 11', 13A, 13B, 13A' 13B') of the circuit schematic 18 in FIG. 3 are connected by the first, the second, the third, and the fourth local interconnect structures (100, 100', 110, 110'). Specifically, the first local interconnect structure 100 according to the present invention serves the function of the first internal node 11 in FIG. 3. The second local interconnect structure 100' according to the present invention serves the function of the second internal node 11' in FIG. 3. The third local interconnect structure 110 according to the present invention serves the function of the third and fourth internal nodes (13A, 13B) in FIG. 3. The fourth local interconnect structure 110' according to the present invention serves the function of the fifth and sixth internal nodes (13A, 13B) in FIG. 3.

Figure 13A:
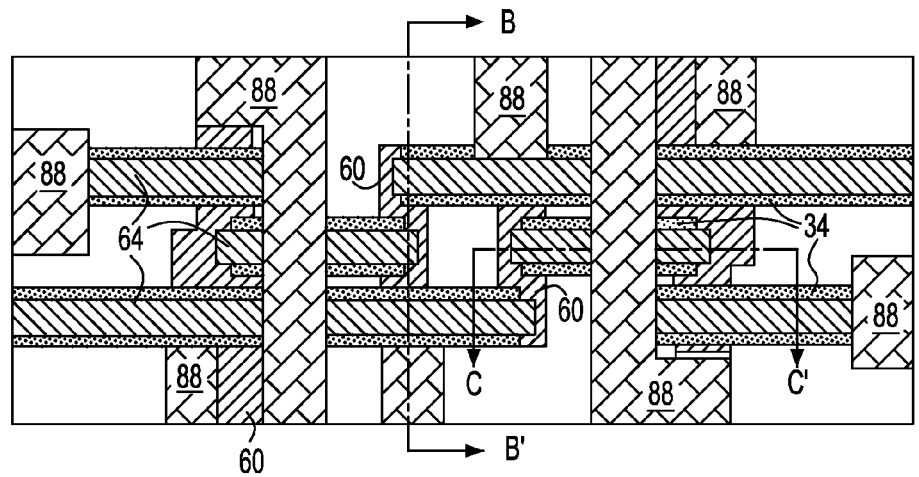
Figure 13B:
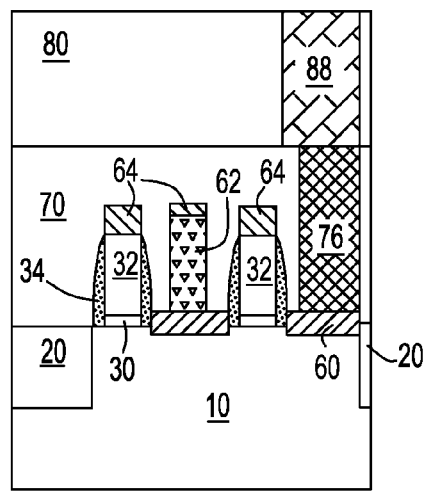
Figure 13C:
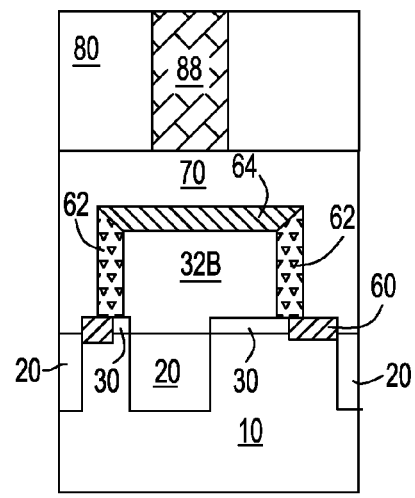

Referring to FIGS. 13A-13C, an M1 dielectric 80 is deposited on the MOL dielectric 70. At least one M1 wire 88 is formed within the M1 level dielectric. The M1 dielectric may comprise undoped silicate glass (USG), fluorosilicate glass (FSG), a spin-on low-k dielectric layer, or a chemical vapor deposition (CVD) low-k dielectric layer. The at least one M1 wire may comprise an aluminum alloy or a copper alloy.

According to a second embodiment of the present invention, the gate conductor lines 32 are formed using an alternate sequence of processing steps.

Referring to FIGS. 14A-14C, after the processing steps corresponding to FIG. 5, a first dielectric layer 51 is deposited directly on the silicon containing layer 31. The first dielectric layer 51 may comprise silicon oxide, silicon nitride, silicon oxynitride, or a silicon germanium alloy with a higher concentration of germanium than the underlying silicon containing layer 31. The thickness of the first dielectric layer 51 may be in the range from about 40 nm to about 300 nm, and is preferably in the range from about 80 nm to about 200 nm.

Figure 15A:
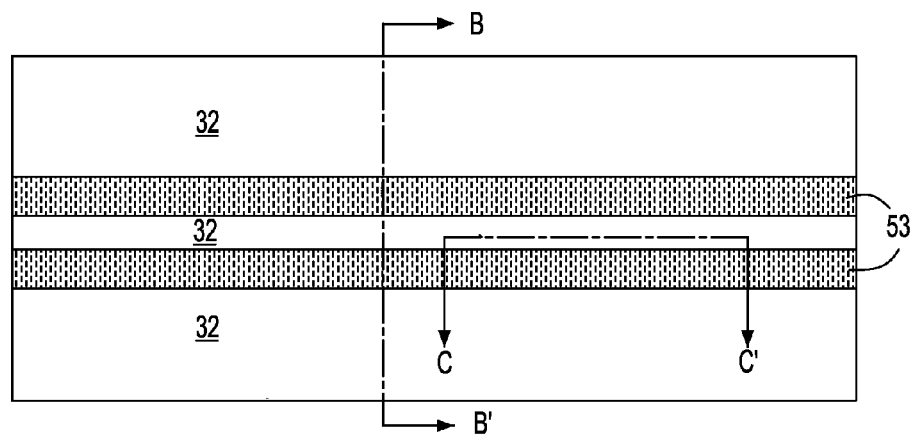
Figures 15B, 15C:
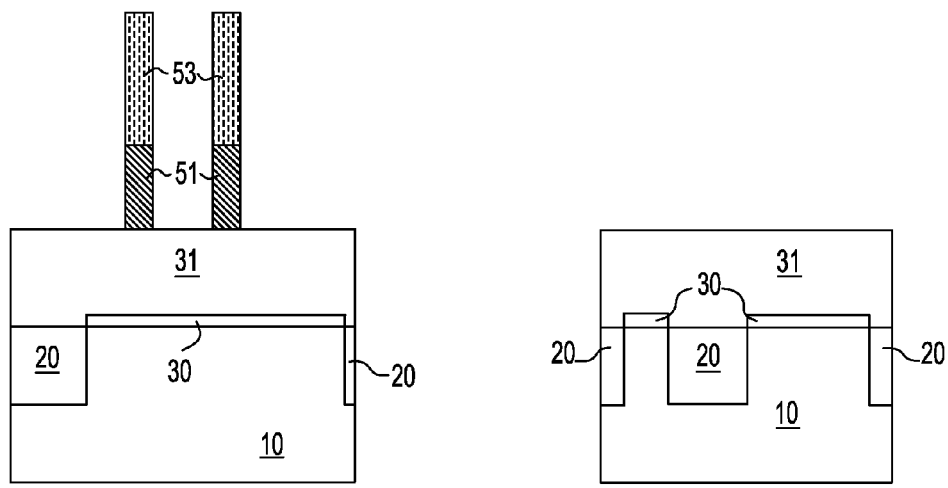

Referring to FIGS. 15A-15C, a third photoresist 53 is applied onto the top surface of the first dielectric layer 51 and is lithographically patterned. The pattern in the third photoresist 53 is transferred into the first dielectric layer 51 by a reactive ion etch (RIE), which is preferably selective to the underlying silicon containing layer 31.

Figure 16A:
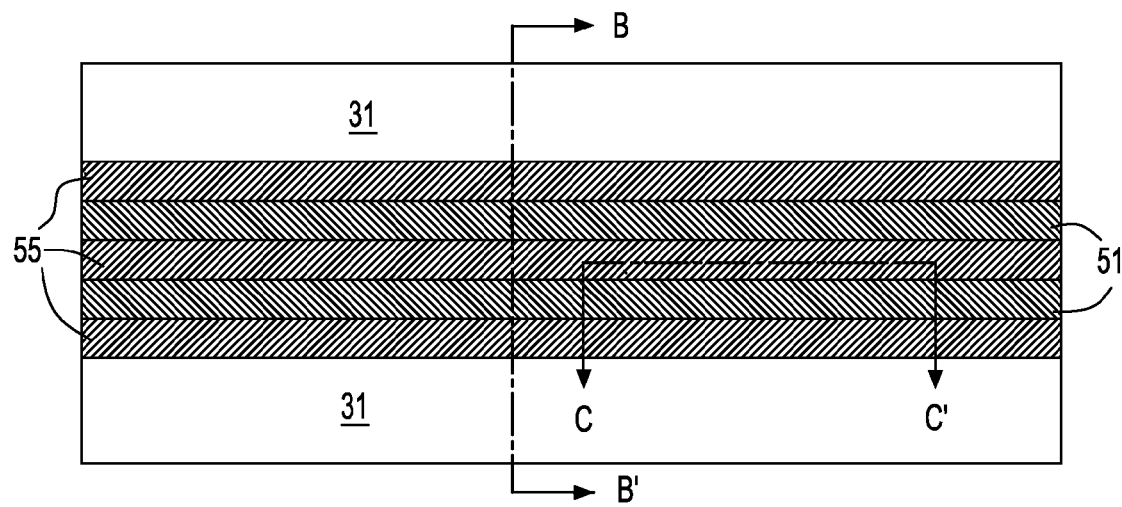
Figure 16B:
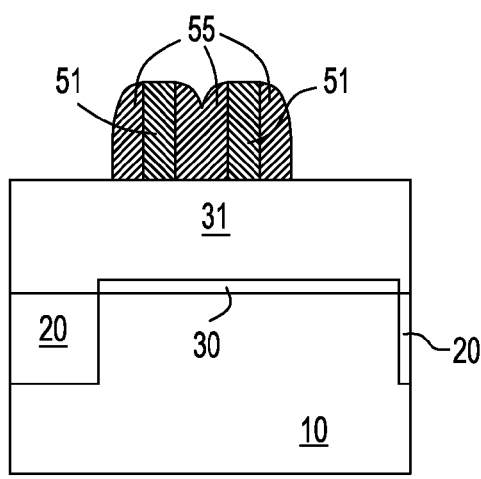
Figure 16C:
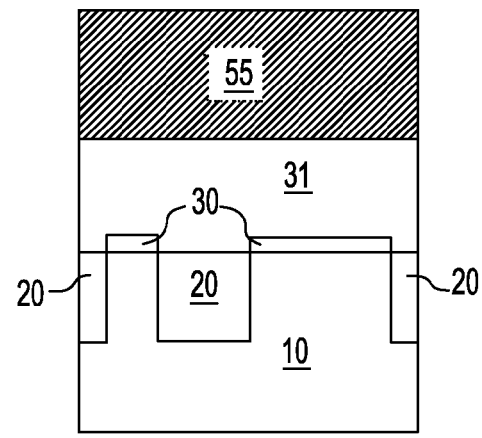

Referring to FIGS. 16A-16C, second gate spacers 55 are formed by methods well known in the art. For example, a second dielectric layer (not shown) is deposited directly on said patterned first dielectric layer 51. Preferably, the deposition of the second dielectric layer is conformal. The thickness of the second dielectric layer may be in the range from about 40 nm to about 300 nm, and is preferably in the range from about 80 nm to about 200 nm. The second dielectric layer may comprise silicon nitride, silicon oxide, silicon oxynitride, or a silicon germanium alloy with a higher concentration of germanium than the underlying silicon containing layer 31. The composition of the first dielectric layer 51 is different from the composition of the second dielectric layer in order to provide selectivity to subsequent etch processes. After the deposition of the second dielectric layer, the second dielectric spacers 55 are formed by another reactive ion etch (RIE) of the second dielectric layer, which is preferably selective to the first dielectric layer 51 and the underlying silicon containing layer 31.

Referring to FIGS. 17A-17C, the first dielectric layer 51 is removed by yet another RIE or preferably by a wet etch. The etch process is selective to the second dielectric spacers 55 and to the underlying silicon containing layer 31.

Referring to FIGS. 18A-18C, still another RIE is employed to transfer the pattern formed by the second dielectric spacers 55 into the underlying silicon containing layer 31 and into the gate dielectric 30. The silicon containing layer 31 is patterned and forms gate conductor lines 32.

Subsequently, the second dielectric spacers 55 are removed from above the gate conductor lines 32 to form a structure shown in FIGS. 7A-7C. Processing sequence thereafter according to the second embodiment is identical to the processing sequence according to the first embodiment of the present invention.

Figure 19A:
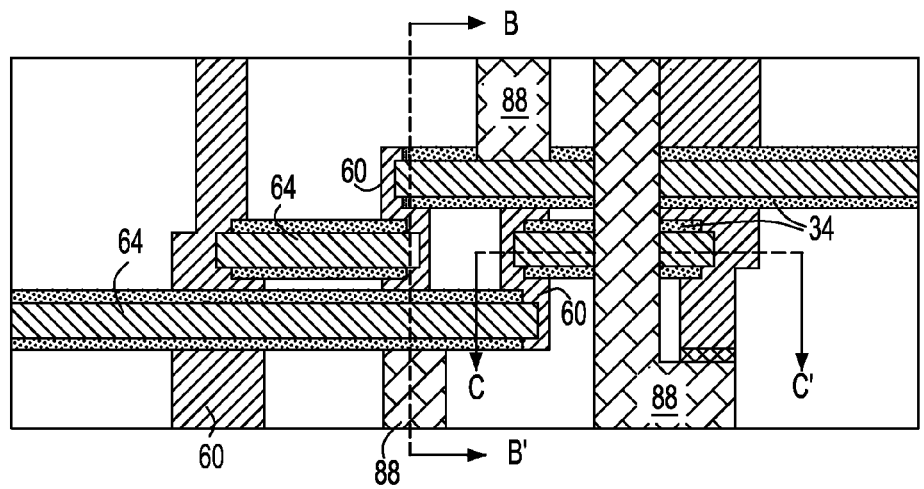
FIGS. 19A-19C show an alternate exemplary semiconductor structure according to the present invention illustrating a contact via 86 contacting a gate conductor top silicide alloy on a gate conductor line.
Figure 19B:
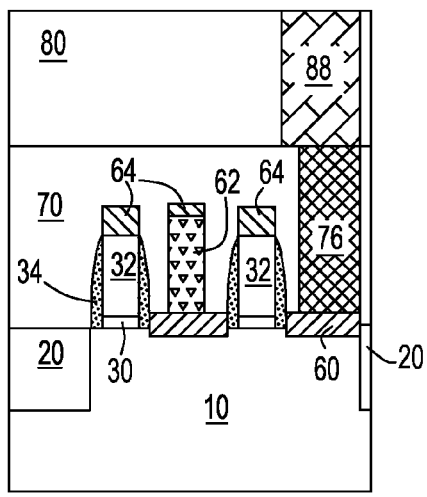
Figure 19C:
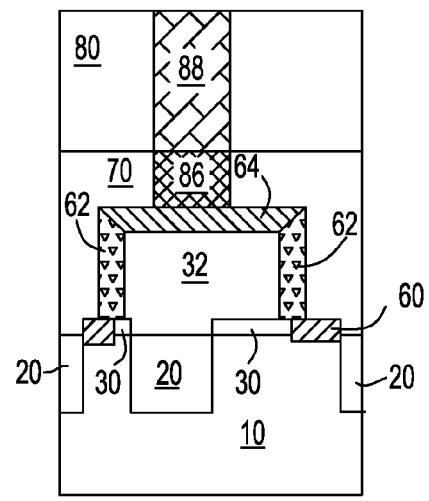

Referring to FIGS. 19A-19C, an alternate exemplary semiconductor structure comprises a semiconductor substrate 10, shallow trench isolation 20, gate dielectric 30, gate conductor lines 32, gate spacers 34, active area silicide alloys 60, gate conductor sidewall silicide alloys 62, gate conductor top silicide alloys 64, a MOL dielectric 70, CA contact vias 76, a M1 dielectric 80, and M1 wires 88 as previously shown in FIGS. 13A-13C. The alternate exemplary semiconductor structure further comprises a contact via 86 that contacts one of the gate conductor top silicide alloy 64 and is embedded in the MOL dielectric 70. While the contact via 86 is not employed in the exemplary SRAM structure shown in FIGS. 4A-18C, the contact via 86 maybe employed in other semiconductor structures.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A static random access memory (SRAM) structure comprising six transistors and a set of six gate conductor lines, wherein said six transistors include:
   a first pair of a first pass gate NFET and a first pull-down NFET, said first pair having a first active area containing a first source/drain of said first pass gate NFET and a first drain of said first pull-down NFET;
   a second pair of a second pass gate NFET and a second pull-down NFET, said second pair having a second active area containing a second source/drain of said second pass gate NFET and a second drain of said second pull-down NFET;
   a first pull-up PFET containing a third active area, wherein said third active area is electrically connected to said first active area through a first gate conductor line and a first gate conductor sidewall silicide alloy, wherein said first gate conductor sidewall silicide alloy is located directly on said first gate conductor line and adjoined to a first active area silicide alloy located directly on said first active area;
   a second pull-up PFET containing a fourth active area, wherein said fourth active area is electrically connected to said second active area through a second gate conductor line and a second gate conductor sidewall silicide alloy, wherein said second gate conductor sidewall silicide alloy is located directly on said second gate conductor line and adjoined to a second active area silicide alloy located directly on said second active area,
wherein said four active areas comprise a semiconductor material and said set of six gate conductor lines are arranged as three groups of parallel gate conductor lines located over said four active areas, wherein each group is laterally spaced from, and is parallel to, the other two groups, and each of said six gate conductor lines comprise a semiconductor material, and said three groups of parallel gate conductor lines include:
   a first group including said first gate conductor line and said second gate conductor line, wherein said first and second gate conductor lines are located along a first line.

2. The SRAM structure of claim 1, further comprising:
   a third gate conductor sidewall silicide alloy located directly on said first gate conductor line and adjoined to a third active area silicide alloy located directly on said third active area; and
   a fourth gate conductor sidewall silicide alloy located directly on said second gate conductor line and adjoined to a fourth active area silicide alloy located directly on said fourth active area.

3. The SRAM structure of claim 2, further comprising:
   a fifth gate conductor sidewall silicide alloy located directly on a gate conductor of said second pull-up PFET and adjoined to said third active area silicide alloy; and
   a sixth gate conductor sidewall silicide alloy located directly on a gate conductor of said first pull-up PFET and adjoined to said fourth active area silicide alloy.

4. The SRAM structure of claim 2, further comprising:
   a first gate dielectric directly contacting said first gate conductor sidewall silicide alloy and said first active area silicide alloy; and
   a second gate dielectric directly contacting said second gate conductor sidewall silicide alloy and said second active area silicide alloy.

5. The SRAM structure of claim 1, further comprising:
   a first gate conductor top silicide alloy located on a top surface of said first gate conductor line; and
   a second gate conductor top silicide alloy located on a top surface of said second gate conductor line.

6. The SRAM structure of claim 1, further comprising shallow trench isolation directly contacting said first gate conductor line and said second gate conductor line.

7. The SRAM structure of claim 1, wherein said three groups of parallel gate conductor lines further include:
   a second group including a third gate conductor line constituting a gate of said first pass gate NFET and a fourth gate conductor line constituting a common gate of said second pull-down NFET and said second pull-up PFET; and
   a third group including a fifth gate conductor line constituting a gate of said second pass gate NFET and a sixth gate conductor line constituting a common gate of said first pull-down NFET and said first pull-up PFET.

8. The SRAM structure of claim 7, wherein said third and fourth gate conductor lines are located along a second line that is parallel to said first line, and wherein said fifth and sixth gate conductor lines are located along a third line that is parallel to said first and second lines.

9. The SRAM structure of claim 1, further comprising:
   at least one contact via in contact with a first active area silicide alloy portion located directly on a drain of said first pass gate NFET;
   at least one contact via in contact with a second active area silicide alloy portion located directly on a source of said first pull-down NFET;
   at least one contact via in contact with a third active area silicide alloy portion located directly on a drain of said second pass gate NFET;
   at least one contact via in contact with a fourth active area silicide alloy portion located directly on a source of said second pull-down NFET;
   at least one contact via in contact with a fifth active area silicide alloy portion located directly on an active are of said first pull-up PFET; and
   at least one contact via in contact with a sixth active area silicide alloy portion located directly on an active are of said second pull-up PFET.

10. The SRAM structure of claim 9, wherein said first gate conductor line and said second gate conductor line do not contact any contact via, and wherein any silicide portion in direct contact with said first gate conductor line or said second gate conductor line is not in contact with any contact via.

11. The SRAM structure of claim 3, wherein each of said first, second, third, fourth, fifth, and sixth gate conductor sidewall silicide alloys have sidewall surfaces that are parallel among one another.

* * * * *